United States Patent
Tomita et al.

(10) Patent No.: US 11,594,279 B2
(45) Date of Patent: Feb. 28, 2023

(54) ARRAY DEVICE AND WRITING METHOD THEREOF

(71) Applicant: Winbond Electronics Corp., Taichung (TW)

(72) Inventors: Yasuhiro Tomita, Kanagawa (JP); Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/367,651

(22) Filed: Jul. 6, 2021

(65) Prior Publication Data

US 2022/0036947 A1 Feb. 3, 2022

(30) Foreign Application Priority Data

Jul. 31, 2020 (JP) .............................. JP2020-130210

(51) Int. Cl.
*G11C 11/00* (2006.01)
*G11C 13/00* (2006.01)

(52) U.S. Cl.
CPC ........ *G11C 13/004* (2013.01); *G11C 13/0026* (2013.01); *G11C 13/0028* (2013.01); *G11C 13/0038* (2013.01); *G11C 13/0069* (2013.01)

(58) Field of Classification Search
CPC ............ G11C 13/0026; G11C 13/0028; G11C 13/0038; G11C 13/0069
USPC .......................................................... 365/148
See application file for complete search history.

(56) References Cited

U.S. PATENT DOCUMENTS

| 5,479,579 | A * | 12/1995 | Duong .................... | G06N 3/063 706/20 |
| 10,573,375 | B1 * | 2/2020 | He ....................... | G11C 13/0069 |
| 2007/0195590 | A1 * | 8/2007 | Sugita ................ | G11C 13/0007 365/163 |
| 2009/0135637 | A1 | 5/2009 | Takase | |
| 2009/0135641 | A1 | 5/2009 | Tajiri et al. | |

(Continued)

FOREIGN PATENT DOCUMENTS

| CN | 110352436 | 10/2019 |
| JP | 2008146711 | 6/2008 |
| JP | 2009093724 | 4/2009 |
| JP | 2016033843 | 3/2016 |
| JP | 2016170840 | 9/2016 |

(Continued)

OTHER PUBLICATIONS

"Office Action of Taiwan Counterpart Application", dated Nov. 25, 2021, p. 1-p. 5.

(Continued)

*Primary Examiner* — Vu A Le
(74) *Attorney, Agent, or Firm* — JCIPRNET (57) ABSTRACT

An array device and a writing method thereof are provided. A synapse array device includes: a crossbar array, in which a resistive memory element is connected to each intersection of a plurality of row lines and a plurality of column lines; a row select/drive circuit selecting a row line of the crossbar array and applying a pulse signal to the selected row line; a column select/drive circuit selecting a column line of the crossbar array and applying a pulse signal to the selected column line; and a writing part writing to the resistive memory element connected to the selected row line and the selected column line. A first write voltage with controlled pulse width is applied to the selected row line, and a second write voltage with controlled pulse width is applied to the selected column line to perform set writing of the resistive memory element.

20 Claims, 8 Drawing Sheets

(56) References Cited

U.S. PATENT DOCUMENTS

| | | |
|---|---|---|
| 2010/0080037 A1 | 4/2010 | Inoue et al. |
| 2012/0092920 A1 | 4/2012 | Hirose |
| 2015/0357036 A1* | 12/2015 | Park .................. G11C 13/0038 |
| | | 365/148 |
| 2015/0380086 A1 | 12/2015 | Park et al. |
| 2016/0035416 A1 | 2/2016 | Sugimae et al. |
| 2016/0196876 A1 | 7/2016 | Lee et al. |
| 2016/0267974 A1 | 9/2016 | Miyazaki et al. |
| 2018/0101359 A1 | 4/2018 | Harada et al. |
| 2019/0147330 A1 | 5/2019 | Otsuka et al. |
| 2020/0082879 A1 | 3/2020 | Chen et al. |

FOREIGN PATENT DOCUMENTS

| | | |
|---|---|---|
| JP | 6723402 | 7/2020 |
| TW | I571875 | 2/2017 |
| TW | I674534 | 10/2019 |
| WO | 2006134732 | 12/2006 |
| WO | 2008068991 | 6/2008 |
| WO | 2010095296 | 8/2010 |
| WO | 2018016176 | 1/2018 |

OTHER PUBLICATIONS

"Office Action of Japan Counterpart Application", dated Jul. 28, 2021, p. 1-p. 5.
"Office Action of Japan Counterpart Application", dated Mar. 2, 2022, p. 1-p. 9.
"Office Action of Korea Counterpart Application", dated Dec. 1, 2022, with English translation thereof, pp. 1-9.

* cited by examiner

ARRAY DEVICE AND WRITING METHOD THEREOF

CROSS-REFERENCE TO RELATED APPLICATION

This application claims the priority benefit of Japan application serial no. 2020-130210, filed on Jul. 31, 2020. The entirety of the above-mentioned patent application is hereby incorporated by reference herein and made a part of this specification.

BACKGROUND OF THE INVENTION

Field of the Invention

The invention relates to a crossbar array device adopting a variable resistance memory element, and more particularly to a synapse array device that may be used for writing in a neuron network.

Description of Related Art

Artificial neural network is introduced as a software algorithm in recognition and classification techniques such as pattern recognition, and has become a necessary technique for installation via highly integrated digital complementary metal-oxide-semiconductor (CMOS) techniques. Neural networks installed via a digital technique have gradually reached their limits in terms of power and scale. Moreover, in recent years, research and development of neural networks using resistive elements as synapses have been conducted.

The learning in neural networks, that is, the setting of synapse bonding strength to an appropriate value, is mainly carried out via back propagation algorithm (BPA). The most important part of BPA is fine-tuning the strength of synapses during learning. When the adjustment of synapse strength is nonlinear and steep, BPA is difficult to converge.

Figure 1:
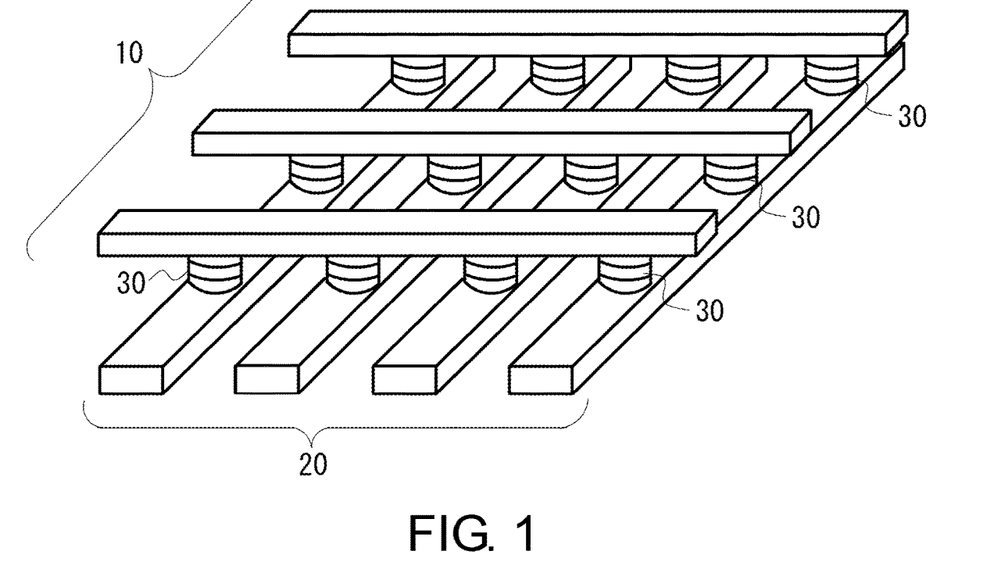
FIG. 1 is a diagram showing a structural example of a crossbar array.

From the viewpoint of integration, a synapse array using variable resistive elements in a crossbar structure is the most preferable structure. It is particularly desirable to use a metal transition oxide such as hafnium oxide, which has a high affinity for CMOS processes, as the variable resistive element. An example of a crossbar array using variable resistive elements is shown in FIG. 1. The crossbar array includes a plurality of row lines 10 extended in the row direction, a plurality of column lines 20 extended in the column direction in a manner orthogonal to the row lines 10, and variable resistive memory elements 30 connected to the intersection between each row line 10 and column line 20. The variable resistive memory elements 30 store different resistance states by applying voltage or current.

The write speed to the variable resistive memory elements, that is, the voltage dependence of the resistance change, is peculiar to a metal transition oxide such as hafnium oxide. The voltage dependence of the resistance change at the setting side is very large compared to the reset side. Therefore, the controllability of a multi-level cell (MLC) storing a multi-bit resistance state in one variable resistive memory cell is not excellent. This means that it is difficult to perform BPA during the learning process. However, if a suitably low write power is used, pulse width control may be used to make the change of the resistance value of set writing gentler.

Figure 2A:
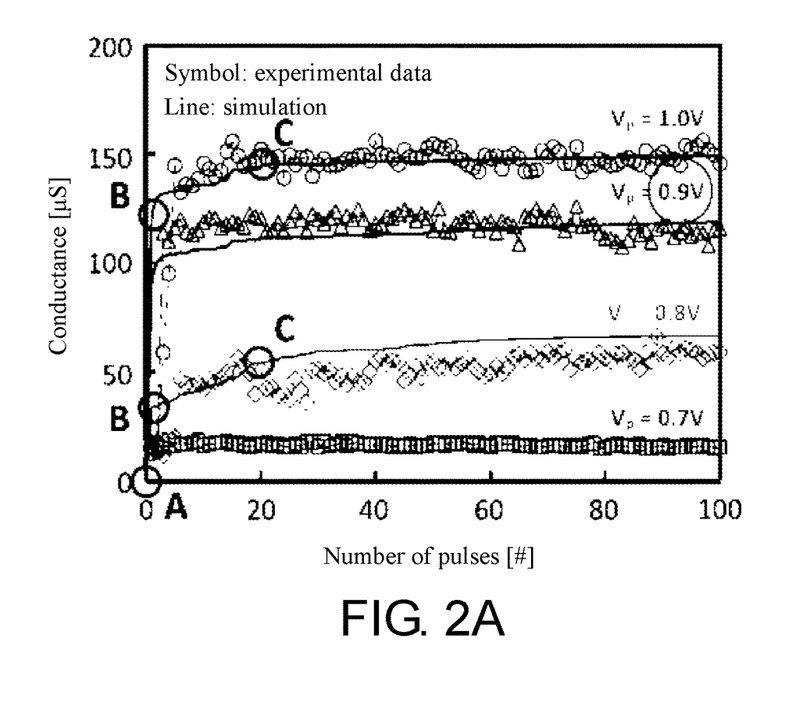
FIG. 2A is a graph showing the set writing characteristics of HfOx.

FIG. 2A is a figure showing the setting characteristics of variable resistive memory elements containing hafnium oxide, and the vertical axis represents conductance, and the horizontal axis represents the number of pulses applied by the write voltage. It shows the conductance when the pulse voltage of set writing is changed to Vp=0.7 V, Vp=0.8 V, Vp=0.9 V, and Vp=1.0 V. It may be seen that the greater the pulse voltage, the greater the conductance. It should be noted here that when Vp=1.0 V, the resistance value is changed drastically at a voltage in the range of only 300 mV.

Figure 2B:
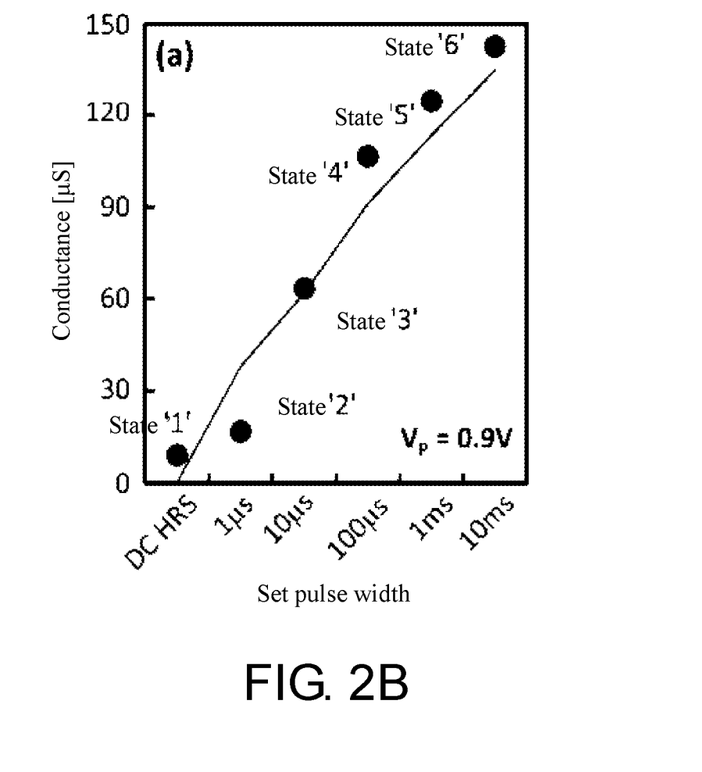
FIG. 2B is a graph showing the set writing characteristics of HfOx.

The upper figure in FIG. 2B shows the conductance when the pulse voltage is fixed at Vp=0.9 and the pulse application time is changed to tp=10 us, tp=100 us, and tp=1 ms. The figure below shows the relationship between conductance and pulse width (application time) at a certain number of pulses. According to these figures, the longer the pulse width, the greater the conductance. In this way, if the pulse voltage is set low and the pulse width is appropriately controlled, fine adjustment of the resistance value of set writing may be achieved.

SUMMARY OF THE INVENTION

An object of the invention is to provide a variable resistive crossbar array device that may more accurately control the change of the resistance value during set writing via pulse width control.

A writing method of the invention is a method of writing to a crossbar array using a bipolar variable resistive memory element, in which a first write voltage with a controlled pulse width is applied to a selected row line of the crossbar array, and a second write voltage with a controlled pulse width is applied to a selected column line. In this way, writing is performed on a selected variable resistive memory element.

An array device of the invention includes: a crossbar array, in which a variable resistive memory element is connected to each intersection of a plurality of row lines and a plurality of column lines; a row select part selecting a row line of the crossbar array; a column select part selecting a column line of the crossbar array; and a writing part writing a variable resistive memory element connected to a row line selected by the row select part and a column line selected by the column select part, wherein the writing part applies a first write voltage with a controlled pulse width to the row line and applies a second write voltage with a controlled pulse width to the column line to write to a selected variable resistive memory element.

According to the invention, since a voltage with a controlled pulse width is used for writing to the variable resistive memory elements, the change in the resistance value of the variable resistive memory elements may be controlled with high accuracy.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Implements of the invention are described in detail with reference to figures. In an embodiment of the invention, a crossbar array is used as a synapse array device for forming a neural network. The crossbar array includes a variable resistive memory element as a memristor at the intersection of the matrix. The variable resistive memory element is a bipolar type, and different conductance states (high resistance state and low resistance state) may be stored by applying current or voltage with different polarities. The variable resistive memory element forms a synapse, and the crossbar array forms a synapse array device. The synapse array device is integrated into a computer device or computer system, and is responsible for at least a part of data processing or arithmetic processing performed by a microprocessor, a central processing unit (CPU), etc. In other embodiments of the invention, the crossbar array is used as a multiplication and accumulation processing device used to form artificial intelligence (AI) hardware. In the following embodiments, an example of applying a crossbar array to a neural network-like synapse array device is described.

Figure 3:
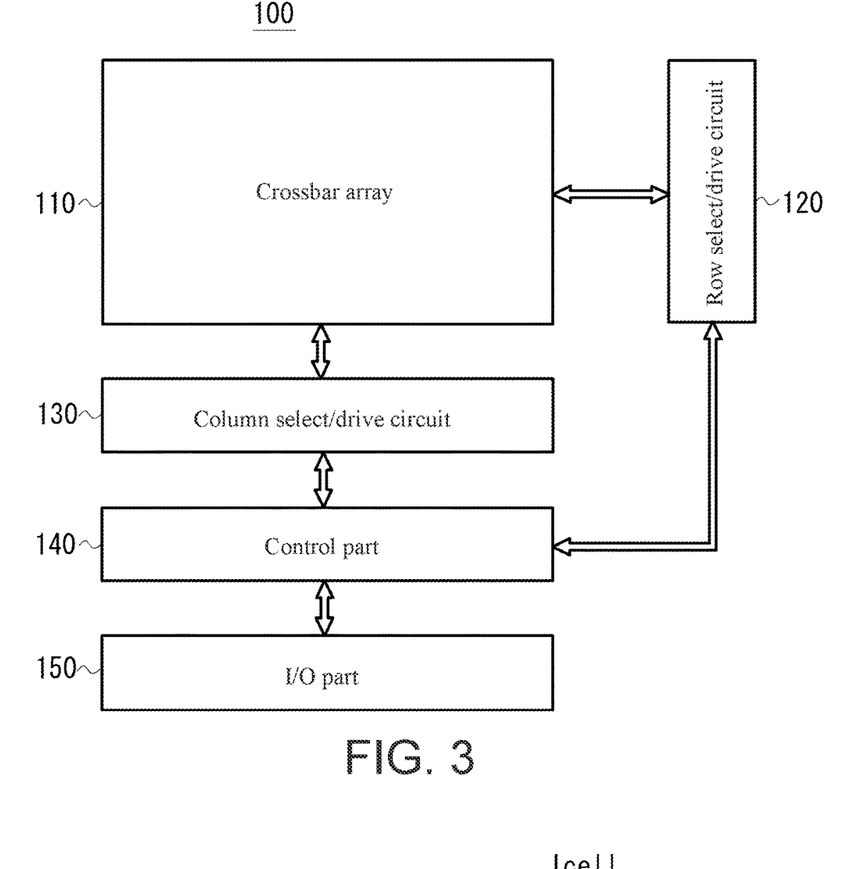
FIG. 3 is a block diagram showing an example of a synapse array device of an embodiment of the invention.

FIG. 3 is a block diagram showing a structural example of a synapse array device of an embodiment of the invention. A synapse array device 100 of the present embodiment includes a crossbar array 110 having variable resistive memory elements, a row select/drive circuit 120, a column select/drive circuit 130, a control part 140, and an input/output (I/O) part 150. The synapse array device 100 is mounted in an AI chip or a semiconductor integrated circuit, for example.

The crossbar array 110 includes a plurality of row lines (for example, X lines) extended in the row direction, a plurality of column lines (for example, Y lines) extended in the column direction, and variable resistive memory elements connected to intersections between the row lines and the column lines. The variable resistive memory elements include, for example, a metal transition oxide such as hafnium oxide (HfOx) or tantalum oxide (TaOx). In an embodiment, each variable resistive memory element is integrated with a selector such as a diode. But integration with a row selector is not necessary.

Figures 4A, 4B:
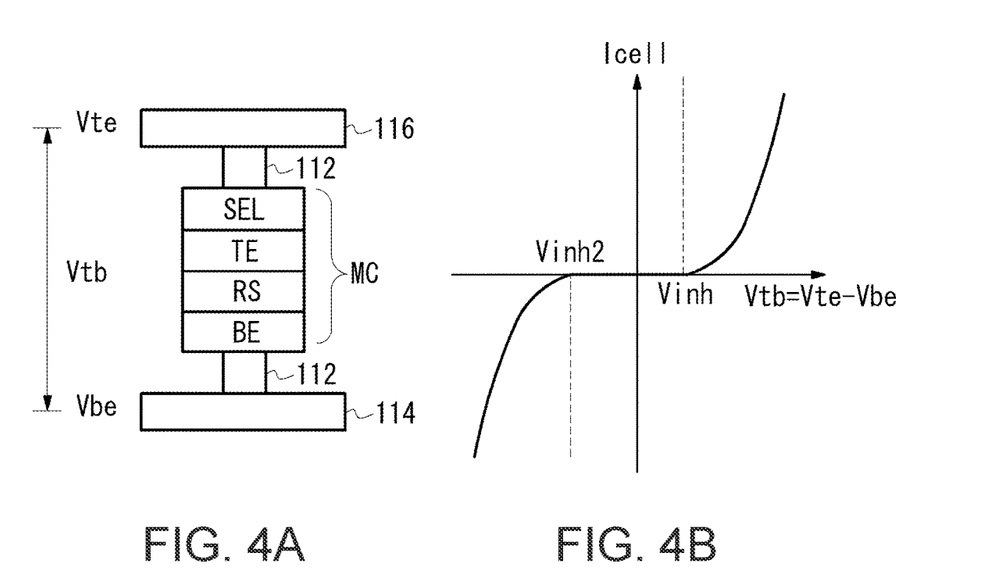
FIG. 4A shows the structure of a variable resistive memory element of the present embodiment.
FIG. 4B is a graph showing the I-V characteristics of a selector.

FIG. 4A is a schematic cross-sectional view of a variable resistive memory element. A variable resistive memory element MC includes a resistance switching layer RS containing a metal transition oxide between a top electrode TE and a bottom electrode BE to form a selector SEL on the top electrode TE. The bottom electrode BE is electrically connected to a bottom conductive layer 114 via a through hole 112, and the selector SEL is connected to a top conductive layer 116 via the through hole 112.

FIG. 4B is a graph showing the I-V characteristics of the selector SEL. The horizontal axis is a bias voltage Vtb between the top conductive layer 116 and the bottom conductive layer 112 (Vtb=a top electrode voltage Vte-a bottom electrode voltage Vbe), and the vertical axis is a current Icell flowing through the selector SEL. The selector SEL is a bidirectional diode having the following characteristics: when the forward bias is a certain value or higher, current flows in the forward direction, and when the reverse bias is a certain value or higher, current flows in the reverse direction. Vinh is the write-inhibit voltage or write-protect voltage applied to the row lines and the column lines of non-selected variable resistive memory elements during set writing, and Vinh2 is the write-inhibit voltage or write-protect voltage applied to the row lines and the column lines of non-selected variable resistive memory elements during reset writing. The write-inhibit voltage Vinh and the write-inhibit voltage Vinh2 are voltages smaller than the threshold voltage when current flows through the selector SEL.

In addition, the number, shape, conductive material, etc. of the row lines and the column lines of the crossbar array 110 are arbitrary. In addition, the crossbar array 110 may also be a three-dimensional structure in which a plurality of crossbar arrays are stacked in the vertical direction.

The row select/drive circuit 120 selects the row lines of the crossbar array 110 based on a row select signal, a control signal, etc. from the control part 140, and a write voltage or a read voltage is applied to selected row lines, or a write-inhibit voltage is applied to non-selected row lines, for example. As described later (refer to FIG. 6A), the row select/drive circuit 120 includes a row select circuit 122 and a pulse generating circuit 124.

The column select/drive circuit 130 selects the column lines of the crossbar array 110 based on a column select signal, a control signal, etc. from the control part 140, and a write voltage or a read voltage is applied to selected column lines, or a write-inhibit voltage is applied to non-selected column lines, for example. As described later (refer to FIG. 6B), the column select/drive circuit 130 includes a column select circuit 132 and a pulse generating circuit 134.

The control part 140 is composed of hardware and/or software, and controls a read operation, a write operation, or other operations (for example, matrix multiplication, accumulation, addition operations, etc.) In an embodiment, the control part 140 includes a microcontroller, a microprocessor, a state machine, etc. having read-only memory/random-access memory (ROM/RAM), etc., and, for example, controls a read operation or a write operation by executing the software stored in ROM/RAM. In addition, the control part 140 may include a sensing circuit, and the sensing circuit senses the voltage or the current of the row or the column selected by the row select/drive circuit 120 or the column select/drive circuit 130 when performing a read operation.

The I/O part 150 is connected to the control part 140 via, for example, an internal data bus, and provides data received from the outside to the control part 140 or outputs data received from the control part 140 to the outside. The control part 140 may obtain data for writing to the variable resistive memory element MC from the I/O part 150.

Figure 5:
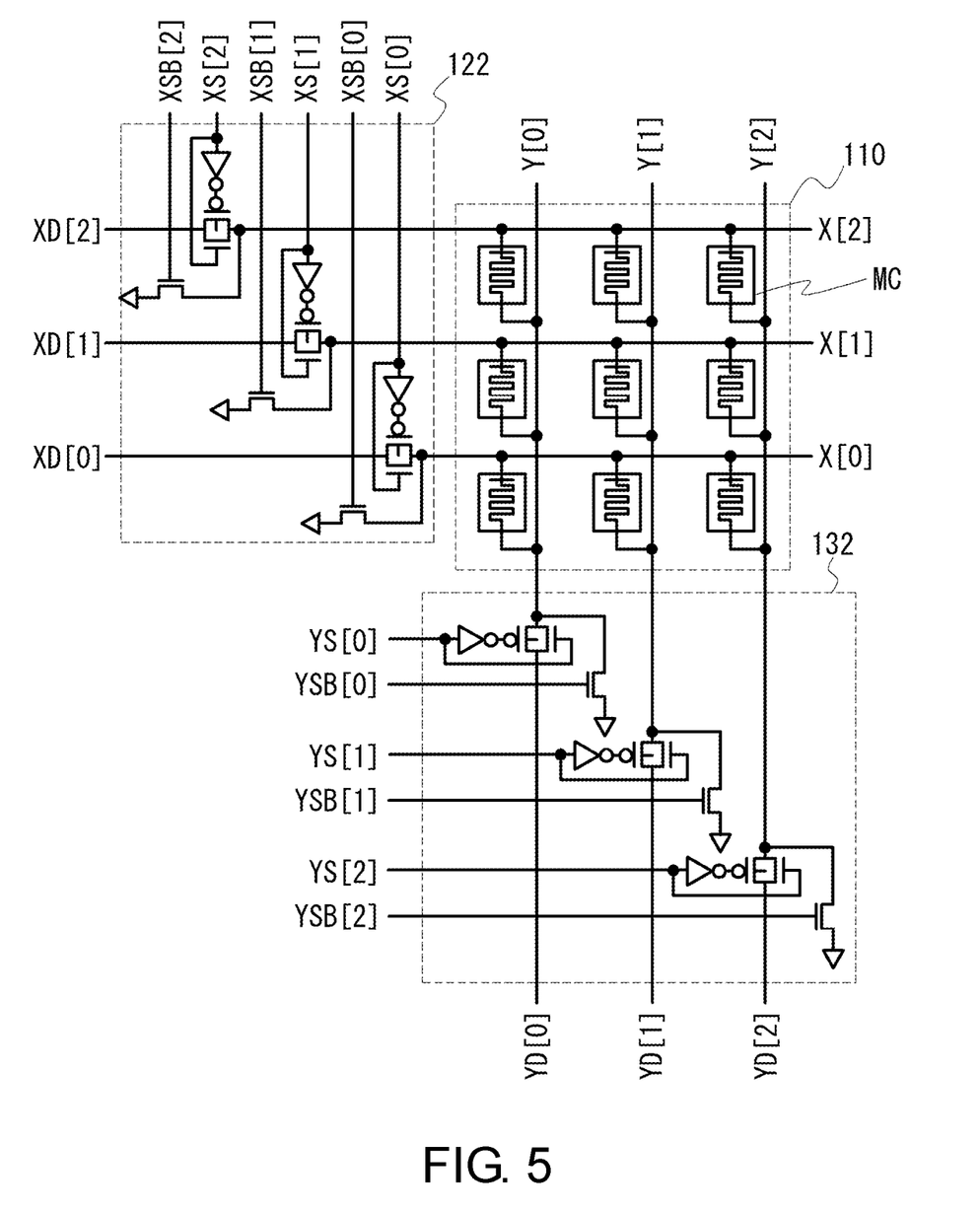
FIG. 5 is a diagram showing a row select circuit and a column select circuit of a row select/drive circuit and a column select/drive circuit of an embodiment of the invention.

FIG. 5 is a diagram showing the structure of the row select circuit 122 included in the row select/drive circuit 120 and the column select circuit 132 included in the column select/drive circuit 130. Here, an array of 3 rows×3 columns is exemplified as a part of the crossbar array 110, and the row direction is set as the X direction, and the column direction is set as the Y direction. The row select circuit 122 includes for each row line: a CMOS pass transistor inputting a pulse drive signal XD[n] generated by the pulse generating circuit 126, an inverter inputting a row select signal XS[n], and an NMOS transistor for which a row select signal XSB[n] is applied to the gate. When the row select signal XS[n] is at the H level, the CMOS channel transistor is turned on, the pulse drive signal XD[n] is applied to a row line X[n], and the NMOS transistor is turned off. When the row select signal XS[n] is at the L level, the CMOS pass transistor is turned off, the NMOS transistor is turned on, and the row line X[n] is connected to the GND level.

The column select circuit 132 includes for each column line: a CMOS pass transistor inputting a pulse drive signal YD[n] generated by the pulse generating circuit 136, an inverter inputting a column select signal YS[n], and an NMOS transistor for which a column select signal YSB[n] is applied to the gate. When the column select signal YS[n] is at the H level, the CMOS channel transistor is turned on, the pulse drive signal YD[n] is applied to a column line Y[n], and the NMOS transistor is turned off. When the column select signal YS[n] is at the L level, the CMOS pass transistor is turned off, the NMOS transistor is turned on, and the column line Y[n] is connected to the GND level.

Figure 6A:
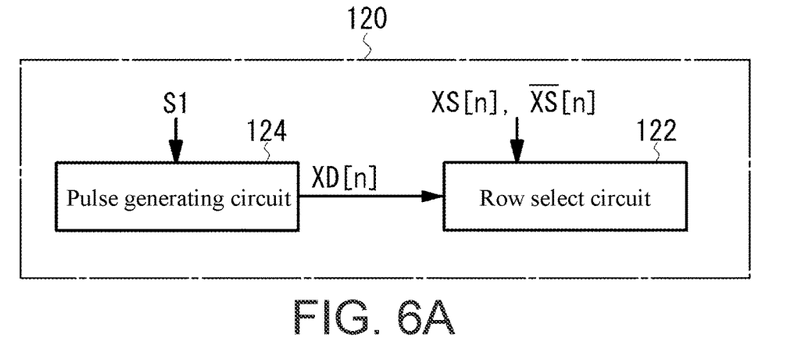
FIG. 6A is a block diagram showing the internal structure of the row select/drive circuit of the present embodiment.

FIG. 6A is a block diagram showing the internal structure of the row select/drive circuit 120. The pulse generating circuit 124 generates a rectangular pulse drive signal XD[n] with a controlled pulse width based on a control signal S1 from the control part 140. During set writing, the pulse generating circuit 124 generates a pulse drive signal XD of a set voltage Vset_X to be applied to the variable resistive memory elements (selected variable resistive memory elements) used as the target of set writing, and generates the pulse drive signal XD of the write-inhibit voltage Vinh to be applied to non-selected variable resistive memory elements. During reset writing, the pulse generating circuit 124 generates the pulse drive signal XD for a reset voltage Vrst_X applied to selected variable resistive memory elements, and generates the pulse drive signal XD of the write-inhibit voltage Vinh2 applied to non-selected variable resistive memory elements. The pulse generating circuit 124 controls the pulse width of the pulse drive signal XD of the set voltage Vset_X, the reset voltage Vrst_X, the write-inhibit voltage Vinh, and the write-inhibit voltage Vinh2 based on the control signal S1 of the control part 140.

Figure 6B:
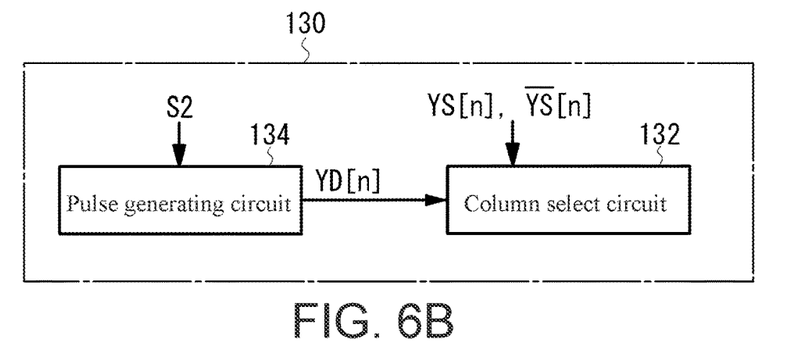
FIG. 6B is a block diagram showing the internal structure of the column select/drive circuit.

FIG. 6B is a block diagram showing the internal structure of the column select/drive circuit 130. The pulse generating circuit 134 generates a rectangular pulse drive signal YD[n] with a controlled pulse width based on a control signal S2 from the control part 140. During set writing, the pulse generating circuit 134 generates a pulse drive signal YD of a set voltage Vset_Y to be applied to the variable resistive memory elements (selected variable resistive memory elements) used as the target of set writing, and generates the pulse drive signal YD of the write-inhibit voltage Vinh to be applied to non-selected variable resistive memory elements. During reset writing, the pulse generating circuit 134 generates the pulse drive signal YD for a reset voltage Vrst_Y applied to selected variable resistive memory elements, and generates the pulse drive signal YD of the write-inhibit voltage Vinh2 applied to non-selected variable resistive memory elements. The pulse generating circuit 134 controls the pulse width of the pulse drive signal YD of the set voltage Vset_Y, the reset voltage Vrst_Y, the write-inhibit voltage Vinh, and the write-inhibit voltage Vinh2 based on the control signal S2 of the control part 140.

Figure 7:
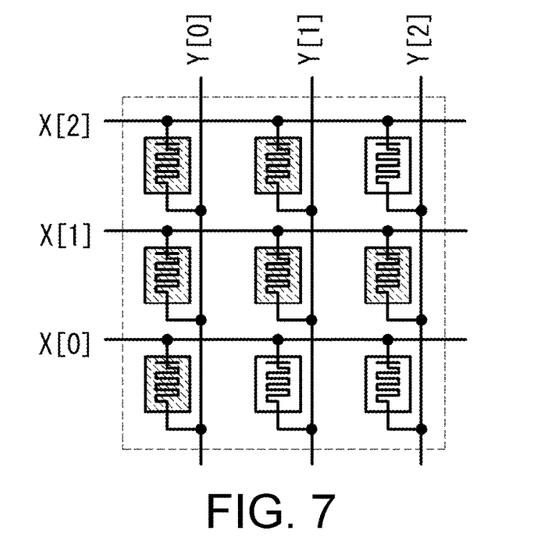
FIG. 7 is a diagram showing a variable resistive memory element subjected to set writing in a crossbar array.

Next, the set writing operation of the synapse array device 100 of the present embodiment is described. FIG. 7 shows a part of the crossbar array 110 (3 rows×3 columns), and set writing is performed on the variable resistive memory elements indicated by diagonal lines. The relationship between the coordinate positions of the variable resistive memory elements as objects of set writing and pulse width is as follows.

XY (coordinate position): P (pulse width)=(2,0):3, (1,0):2, (0,0):1, (2,1):1, (1,1):3, (1,2):1

For example, the drive signal XD[2] of a pulse width P3 is applied to the memory elements of X[2] and Y[0], the drive signal XD[1] of a pulse width P2 is applied to the memory elements of X[1] and Y[0], and a drive signal XD[0] of a pulse width P1 is applied to the memory elements of X[0] and Y[0]. The pulse width P3, the pulse width P2, and the pulse width P1 are specified by the control signal S1 from the control part 140.

Figure 8:
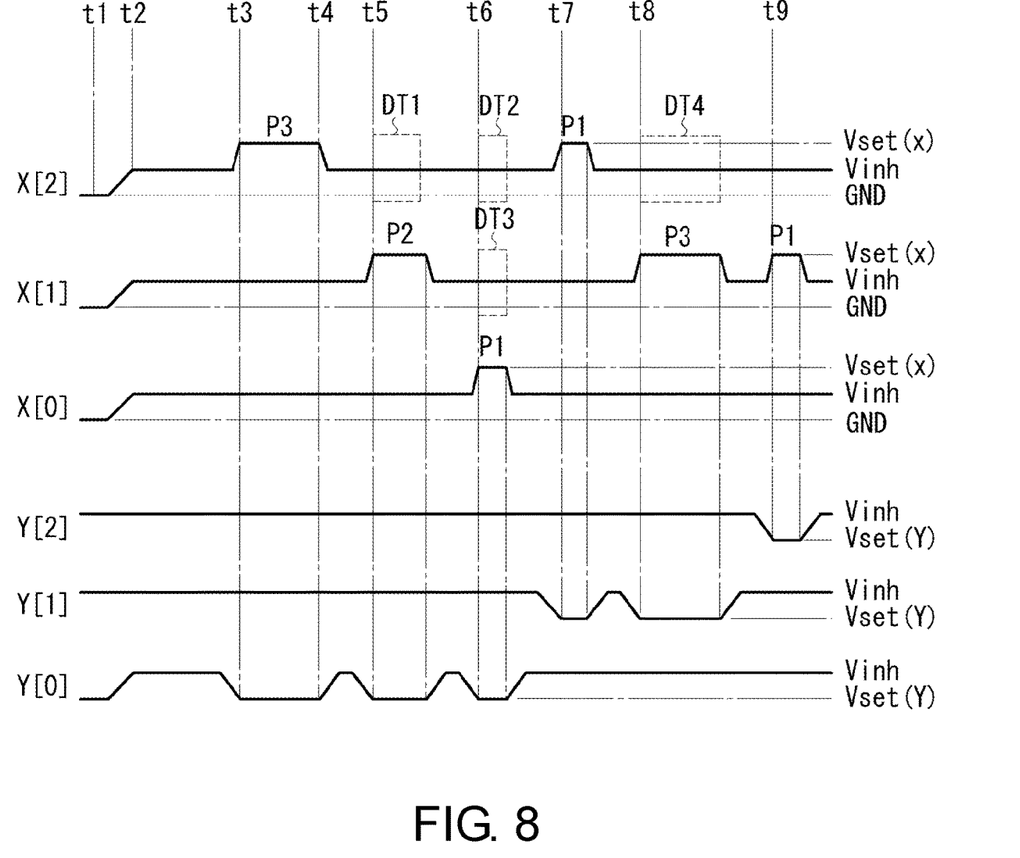
FIG. 8 is a diagram showing pulse waveforms applied when set writing is performed sequentially in units of bits.

FIG. 8 shows a pulse waveform when set writing is performed by pulse width control on the variable resistive memory elements shown in FIG. 7 in units of bits. At time t1, a non-selective bias is applied to all arrays. That is, GND is applied to all of the row line X[0], the row line X[1], and the row line X[2], and GND is applied to all of the column line Y[0], the column line Y[1], and the column line Y[2]. Here, the voltage Vset_Y=GND.

At time t2, write-inhibit voltage Vinh is applied to the row line X[0], the row line X[1], the row line X[2], and the column line Y[0], the column line Y[1], and the column line Y[2]. The write-inhibit voltage Vinh is a voltage lower than the threshold when the current Icell flows in the selector SEL. Therefore, the set writing of the variable resistive elements is not performed by the write-inhibit voltage Vinh.

At time t3, the pulse drive signal XD[2] of the set writing voltage Vset_X of the pulse width P3 is applied to the row line X[2]. At the same time, the pulse drive signal YD[2] of the set writing voltage Vset_Y (GND) of the pulse width P3 is applied to the column line Y[0]. Vset_X is a voltage higher than the threshold voltage of the selector SEL, and a low-resistance state corresponding to the pulse width P3 is stored in the variable resistive elements. At time t4 when the pulse width P3 is decreased, the write-inhibit voltage Vinh is applied to the row line X[2], and the write-inhibit voltage Vinh is applied to the column line Y[0].

At time t5, the pulse drive signal XD[1] of the set writing voltage Vset_X of the pulse width P2 is applied to the row line X[1]. At the same time, the pulse drive signal YD[1] of the set writing voltage Vset_Y (GND) of the pulse width P2 is applied to the column line Y[0]. The write-inhibit voltage Vinh is applied to the row line X[1] and the column line Y[0] in synchronization with the timing when the pulse width P2 is decreased. During this write period, the memory element at the coordinate position (2,0) is in a low-resistance state and therefore has crosstalk (the period indicated by a dotted line DT1 in the figure).

At time t6, the pulse drive signal XD[0] of the set writing voltage Vset_X of the pulse width P1 is applied to the row line X[0]. At the same time, the pulse drive signal YD[0] of the set writing voltage Vset_Y (GND) of the pulse width P1 is applied to the column line Y[0]. The write-inhibit voltage Vinh is applied to the row line X[0] and the column line Y[0] in synchronization with the timing when the pulse width P1 is decreased. In this write period, the memory elements at the coordinate position (2,0) and the coordinate position (1,0) are each in a low-resistance state and therefore have crosstalk (the period indicated by the dotted line DT1 and a dotted line DT3 in the figure).

Next, at time t7, the pulse drive signal XD[2] of the set writing voltage Vset_X of the pulse width P1 is applied to the row line X[2]. At the same time, the pulse drive signal YD[1] of the set writing voltage Vset_Y (GND) of the pulse width P1 is applied to the column line Y[1]. At time t8, the pulse drive signal XD[1] of the set writing voltage Vset_X of the pulse width P3 is applied to the row line X[1]. At the same time, the pulse drive signal YD[1] of the set writing voltage Vset_Y (GND) of the pulse width P3 is applied to the column line Y[1]. Via this writing, during the period indicated by DT4, the memory element at the coordinate position (2,1) has crosstalk. At time t9, the pulse drive signal XD[1] of the set writing voltage Vset_X of the pulse width P1 is applied to the row line X[1]. At the same time, the pulse drive signal YD[2] of the set writing voltage Vset_Y (GND) of the pulse width P1 is applied to the column line Y[2].

The writing method is to write based on each memory element, and therefore the current density during writing is the smallest, but the write time depends on the data mode of set writing.

Figure 9:
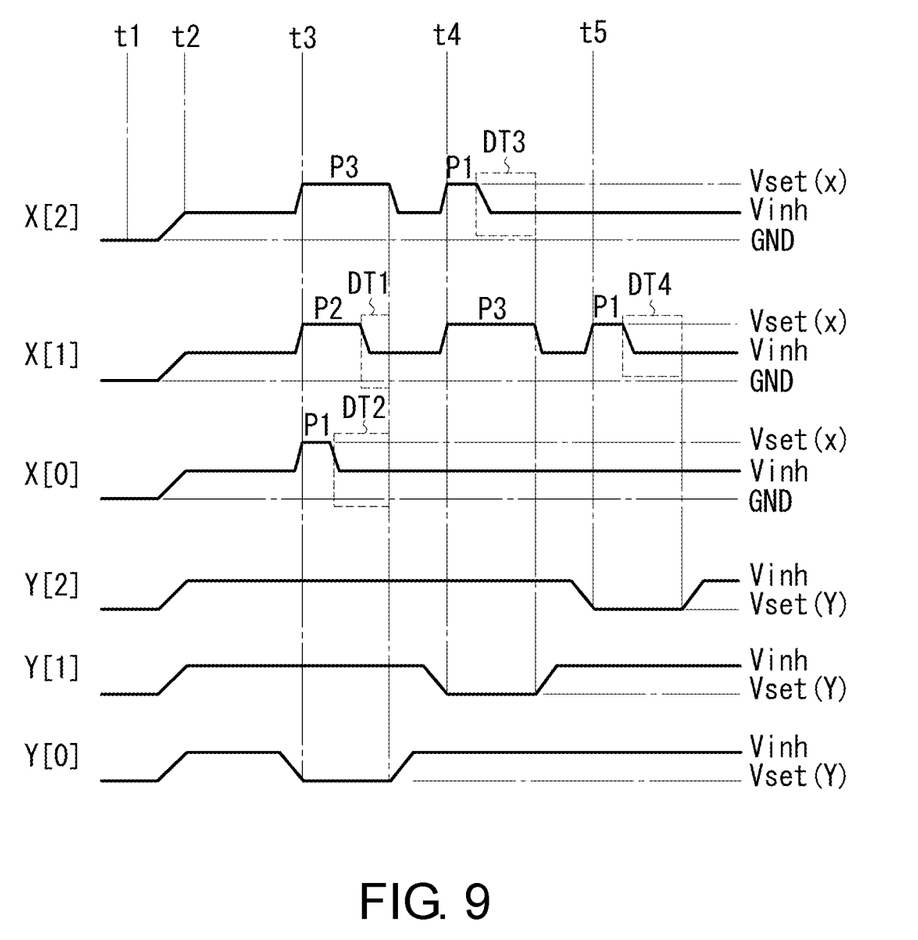
FIG. 9 is a diagram showing pulse waveforms applied when set writing is simultaneously performed in parallel in units of columns according to an embodiment of the invention.

In addition, the set writing method provided by the present embodiment improves the writing method based on each memory element of FIG. 8, and the column lines are used as common electrodes for GND, and the memory elements in the row direction are simultaneously written in parallel for each row. FIG. 9 shows the pulse waveform when set writing is performed based on the pulse width control of the present embodiment.

At time t1, a non-selective bias is applied to all arrays. That is, GND is applied to all of the row line X[0], the row line X[1], and the row line X[2], and GND is applied to all of the column line Y[0], the column line Y[1], and the column line Y[2]. At time t2, the write-inhibit voltage Vinh is applied to the row line X[0], the row line X[1], the row line X[2], and the column line Y[0], the column line Y[1], and the column line Y[2].

At time t3, the pulse drive signal XD[2] of the pulse width P3 is applied to the row line X[2], the pulse drive signal XD[1] of the pulse width P2 is applied to the row line X[1], the pulse drive signal XD[0] of the pulse width P1 is applied to the row line X[0], and the pulse drive signal YD[0] of the set writing voltage Vset_Y (GND) is applied to the column line Y[0] at the same time. The rising edge of each of the pulse width P1, the pulse width P2, and the pulse width P3 of the pulse drive signal XD applied to the row lines is aligned with the falling edge of the voltage Vset_Y of the pulse drive signal YD applied to the row lines. In addition, the pulse width of the set writing voltage Vset_Y of the pulse drive signal YD is set to the maximum value of the pulse width applied to the row lines or fixed to the maximum value of the algorithm In the latter case, the write time becomes constant, which has the advantage of easy control for the host controller. Here, the pulse width of the pulse drive signal YD is set to P3.

During this writing process, during the periods indicated by DT1 and DT2, the memory elements of coordinate (1,0) and coordinate (0,0) have crosstalk. However, the crosstalk period DT1 is P3-P2, and the period DT2 is P3-P1. Therefore, compared with the case where writing is performed based on each memory element shown in FIG. 8, the time of crosstalk is reduced.

At the next time t4, the pulse drive signal XD[2] of the pulse width P1 is applied to the row line X[2], the pulse drive signal XD[1] of the pulse width P3 is applied to the row line X[1], and the pulse drive signal YD[1] of the set writing voltage Vset_Y (GND) of the pulse width P3 is applied to the column line Y[1]. By this writing, in the period indicated by DT3, crosstalk occurs to the memory element at coordinate (2,1), but the period of crosstalk DT3 is P3-P1, and therefore crosstalk may be reduced compared to the case of FIG. 8.

At the next time t5, the pulse drive signal XD[1] of the pulse width P1 is applied to the row line X[1], and the pulse drive signal YD[2] of the set writing voltage Vset_Y (GND) of the pulse width P3 is applied to the column line Y[2]. By this writing, in the period indicated by DT4, crosstalk occurs to the memory element at coordinate (1,2), but the period of crosstalk DT4 is P3-P1, and therefore crosstalk may be reduced compared to the case of FIG. 8.

Therefore, according to the set writing method of the present embodiment, a plurality of memory elements are written at the same time in units of columns. Therefore, the write time may be shortened compared to the case where writing is performed based on each memory element. In addition, crosstalk to non-selected memory elements may be reduced, and the change of the resistance value of the memory elements may be controlled more accurately.

According to the embodiment, the writing method synchronizes the rising edge of the pulse of the set writing voltage Vset_X of the row lines with the falling edge of the pulse of the set writing voltage Vset_Y of the column lines. Therefore, there is an advantage that the circuit structure of the pulse generating circuit 124 and the pulse generating circuit 134 may be simplified. But this situation means that non-selected memory elements in the low-resistance state (LRS) have crosstalk.

Figure 10:
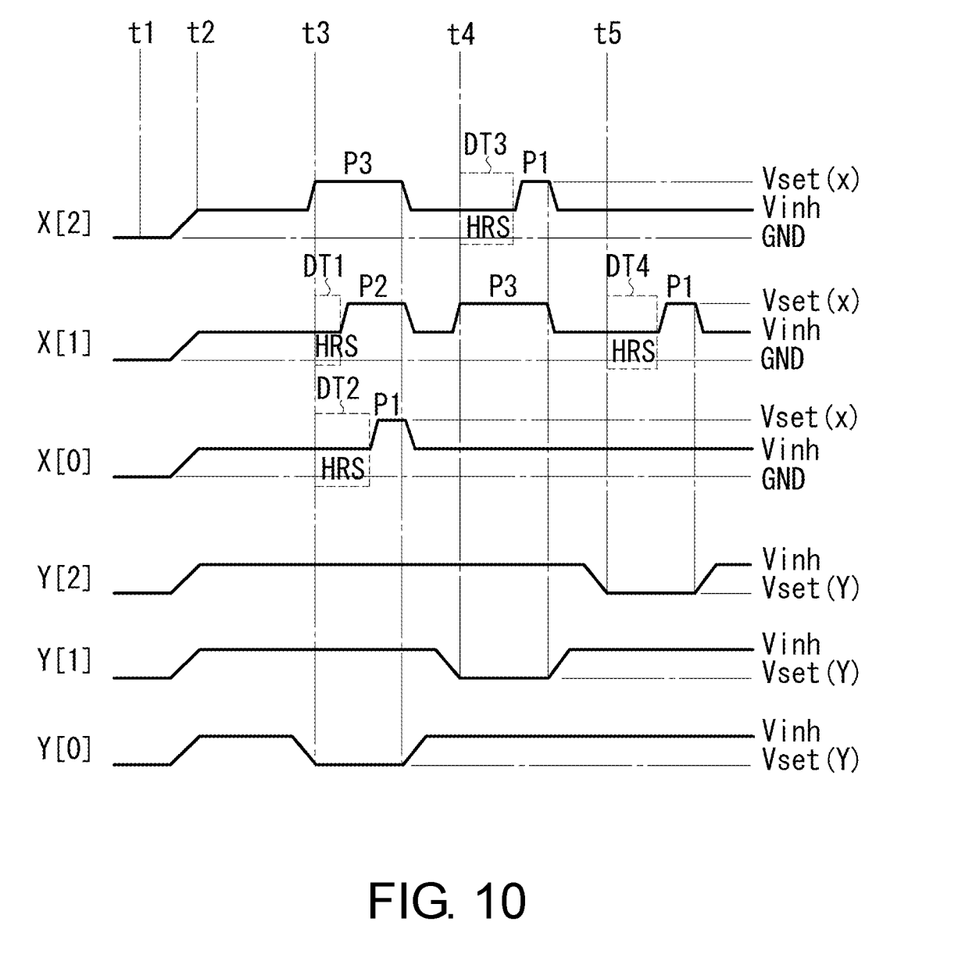
FIG. 10 is a diagram showing pulse waveforms applied when set writing is simultaneously performed in parallel in units of columns according to another embodiment of the invention.

FIG. 10 shows a writing method that is further improved from the writing method of the embodiment, so that the falling edge of the pulse of the set writing voltage Vset_X of the row lines is aligned with the rising edge of the pulse of the set writing voltage Vset_Y of the column lines. The falling edge of the pulse width P3 is aligned with the falling edges of the pulse widths P2 and P1.

When writing the column line Y[0], at time t3, the set writing voltage Vset_X of the pulse width P3 is applied to the row line X[2]. In the periods indicated by DT1 and DT2, the row line X[1] and the row line X[0] are the write-inhibit voltage Vinh, and the memory elements at the coordinate position (1,0) and the coordinate position (0,0) are in a high-resistance state (HRS). Therefore, compared with the writing method shown in FIG. 9, crosstalk to memory elements may be reduced. Similarly, when writing the column line Y[1] and the column line Y[2], the non-selected memory elements in the periods indicated by DT3 and DT4 are HRS. Therefore, compared with the writing method shown in FIG. 9, crosstalk to non-selected memory elements may be reduced.

As described in detail above, according to the present embodiment, in a low-voltage write condition, a write-inhibit voltage is applied to non-selected memory elements, whereby voltage difference may be used to inhibit crosstalk. Moreover, pulse width control-based time may also be used to adjust the change of the resistance value (write level) of the memory elements. Such pulse width control-based writing may coexist with the control of the crossbar array. In addition, when pulses at the discharge side are jointly generated in the column direction and the pulse widths thereof are set to the maximum fixed value, by controlling the pulse widths at the charging side in the row direction, control of each execution pulse width may be achieved. If the set writing method provided by the present embodiment is used, a slight change in the resistance value at the setting side of the synapse may be readily achieved. Compared with a sequential writing method in units of bits, high-speed writing and crosstalk reduction may be achieved.

In addition, in the synapse array device of the present embodiment, the variable resistive memory elements constituting the crossbar array are used as synapses, and synapse bonding strength is accurately controlled by pulse time. It is not simple to compensate the write power in the array structure where voltage drop is expected, but in the control of the resistance value by pulse duration, voltage drop in the array is compensated for low voltage and low current, and therefore may be ignored or minimized. In addition, when applied to a synapse, time penalty is not as large as when a general memory is used. Therefore, the writing method based on pulse duration control is effective.

In the present embodiment, an example of applying a crossbar array to a synapse array is shown, but the invention is not limited thereto. The writing method of the crossbar array of the present embodiment may also be applied to other devices (for example, memories, arithmetic logics, etc.)

Preferred embodiments of the invention are described in detail, but the invention is not limited to the specific embodiments, and various modifications and changes may be made within the scope of the invention recited in the claims.

What is claimed is:

1. A writing method of writing to a crossbar array using a bipolar variable resistive memory element, wherein,
the writing method applies a first write voltage with a controlled pulse width to a selected row line of the crossbar array and applies a second write voltage with a controlled pulse width to a selected column line to write to a selected variable resistive memory element,
wherein a writing is performed on a plurality of variable resistive memory elements simultaneously by applying the first write voltage to a plurality of row lines.

2. The writing method of claim 1, wherein the second write voltage is a ground electrode shared in column lines.

3. The writing method of claim 1, wherein a write-inhibit voltage is applied to a non-selected row line and a non-selected column line.

4. The writing method of claim 1, wherein the pulse width of the second write voltage is set to a maximum pulse width of the pulse width of the first write voltage.

5. The writing method of claim 1, wherein a rising edge of a pulse of the first write voltage is aligned with a falling edge of a pulse of the second write voltage.

6. The writing method of claim 1, wherein a falling edge of a pulse of the first write voltage is aligned with a rising edge of a pulse of the second write voltage.

7. An array device, comprising:
a crossbar array, in which a variable resistive memory element is connected to each intersection of a plurality of row lines and a plurality of column lines;
a row select part selecting a row line of the crossbar array;
a column select part selecting a column line of the crossbar array; and
a writing part writing a variable resistive memory element connected to a row line selected by the row select part and a column line selected by the column select part,
the writing part applies a first write voltage with a controlled pulse width to the row line and applies a second write voltage with a controlled pulse width to the column line to write to a selected variable resistive memory element,
wherein the writing part aligns a falling edge of a pulse of the first write voltage with a rising edge of a pulse of the second write voltage.

8. The array device of claim 7, wherein the writing part applies the first write voltage to the plurality of row lines to simultaneously perform a writing on a plurality of variable resistive memory elements.

9. The array device of claim 7, wherein the writing part adjusts the pulse width of the first write voltage and applies a common ground voltage to the column line as the second write voltage.

10. The array device of claim 7, wherein the writing part applies a write-inhibit voltage to a non-selected row line and a non-selected column line.

11. The array device of claim 7, wherein the writing part sets the pulse width of the second write voltage to a maximum pulse width of the pulse width of the first write voltage.

12. The array device of claim 7, wherein the writing part aligns a rising edge of the pulse of the first write voltage with a falling edge of the pulse of the second write voltage.

13. The array device of claim 7, wherein each of the variable resistive memory elements is integrated with a selector, and the selector flows a current when a voltage exceeding a threshold is applied in a forward bias and a reverse bias.

14. The array device of claim 7, wherein the crossbar array is applied to a synapse array.

15. An array device, comprising:
a crossbar array, in which a variable resistive memory element is connected to each intersection of a plurality of row lines and a plurality of column lines;
a row select part selecting a row line of the crossbar array;
a column select part selecting a column line of the crossbar array; and
a writing part writing a variable resistive memory element connected to a row line selected by the row select part and a column line selected by the column select part,
the writing part applies a first write voltage with a controlled pulse width to the row line and applies a second write voltage with a controlled pulse width to the column line to write to a selected variable resistive memory element,
wherein the writing part applies a write-inhibit voltage to a non-selected row line and a non-selected column line.

16. The array device of claim 15, wherein the writing part applies the first write voltage to the plurality of row lines to simultaneously perform a writing on a plurality of variable resistive memory elements.

17. The array device of claim 15, wherein the writing part adjusts the pulse width of the first write voltage and applies a common ground voltage to the column line as the second write voltage.

18. The array device of claim 15, wherein the writing part sets the pulse width of the second write voltage to a maximum pulse width of the pulse width of the first write voltage.

19. The array device of claim 15, wherein the writing part aligns a rising edge of a pulse of the first write voltage with a falling edge of a pulse of the second write voltage.

20. The array device of claim 15, wherein the writing part aligns a falling edge of a pulse of the first write voltage with a rising edge of a pulse of the second write voltage.

\* \* \* \* \*